United States Patent
Tsuzaki

(10) Patent No.: US 8,207,789 B2
(45) Date of Patent: Jun. 26, 2012

(54) DIFFERENTIAL AMPLIFIER CIRCUIT

(75) Inventor: Toshiyuki Tsuzaki, Chiba (JP)

(73) Assignee: Seiko Instruments Inc., Chiba (JP)

(*) Notice: Subject to any disclaimer, the term of this patent is extended or adjusted under 35 U.S.C. 154(b) by 0 days.

(21) Appl. No.: 13/070,151

(22) Filed: Mar. 23, 2011

(65) Prior Publication Data

US 2011/0234319 A1 Sep. 29, 2011

(30) Foreign Application Priority Data

Mar. 29, 2010 (JP) ................................. 2010-076370

(51) Int. Cl.
*H03F 3/45* (2006.01)
(52) U.S. Cl. ........................................ 330/253; 330/257
(58) Field of Classification Search .................. 330/253, 330/255, 257, 261
See application file for complete search history.

(56) References Cited

U.S. PATENT DOCUMENTS

| | | | | |
|---|---|---|---|---|
| 6,762,646 | B1 * | 7/2004 | Bell | 330/257 |
| 7,741,911 | B2 * | 6/2010 | Kao et al. | 330/261 |
| 7,956,690 | B2 * | 6/2011 | Nakao | 330/255 |
| 7,986,188 | B2 * | 7/2011 | Fujiwara | 330/292 |

FOREIGN PATENT DOCUMENTS

JP 06-112737 A 4/1994

* cited by examiner

*Primary Examiner* — Henry Choe
(74) *Attorney, Agent, or Firm* — Brinks Hofer Gilson & Lione

(57) ABSTRACT

Provided is a differential amplifier circuit with a small circuit size. When a differential voltage (Vinp−Vinn) is higher than a predetermined voltage, a PMOS transistor (4) is turned ON. At this time, a current source (12) is connected in parallel to a current source (11), and the current source (12) supplies a drive current to a differential amplifier circuit (10). In other words, the current sources (11 and 12), rather than only the current source (11), supply a total current (I11+I12) to the differential amplifier circuit (10) as the drive current. Accordingly, a slew rate of an output voltage (Vout) is increased. Two PMOS transistors and the current source (12) are simply required for controlling the slew rate of the output voltage (Vout), and hence the differential amplifier circuit (10) is small in circuit size.

6 Claims, 2 Drawing Sheets

DIFFERENTIAL AMPLIFIER CIRCUIT

RELATED APPLICATIONS

This application claims priority under 35 U.S.C. §119 to Japanese Patent Application No. 2010-076370 filed on Mar. 29, 2010, the entire content of which is hereby incorporated by reference.

BACKGROUND OF THE INVENTION

1. Field of the Invention

The present invention relates to a differential amplifier circuit, and more specifically, to a high slew rate differential amplifier circuit.

2. Description of the Related Art

A conventional differential amplifier circuit is described. FIG. 3 is a circuit diagram illustrating the conventional differential amplifier circuit.

A slew rate control circuit 91 includes two differential pairs (not shown) and a current mirror circuit (not shown), and monitors an input voltage Vinp and an input voltage Vinn. The slew rate control circuit 91 does not supply an output current when a differential voltage between the input voltage Vinp and the input voltage Vinn is lower than 0.5 V, and starts to supply the current gradually when the differential voltage is 0.5 V or higher. Then, when the differential voltage between the input voltage Vinp and the input voltage Vinn is 0.9 V or higher, the slew rate control circuit 91 supplies a constant current. Therefore, when the input voltage difference is large, the differential amplifier circuit is driven with the currents supplied from both the slew rate control circuit 91 and a current source 92 so as to increase a slew rate of an output voltage Vout (see, for example, Japanese Patent Application Laid-open No. Hei 06-112737).

In the conventional technology, however, the slew rate control circuit 91 having a complicated circuit configuration is provided and accordingly the differential amplifier circuit is increased in circuit size.

SUMMARY OF THE INVENTION

The present invention has been made in view of the above-mentioned problem, and provides a high slew rate differential amplifier circuit with a small circuit size.

In order to solve the above-mentioned problem, the present invention provides a differential amplifier circuit including: a current mirror circuit which includes a first terminal and a second terminal and is provided to a first power supply terminal; a first current source provided between a first node and a second power supply terminal; a first transistor of second conductivity type, including a gate connected to a second input terminal, a source connected to the first node, and a drain connected to the first terminal of the current mirror circuit; a second transistor of the second conductivity type, including a gate connected to a first input terminal, a source connected to the first node, and a drain connected to the second terminal of the current mirror circuit; a second current source; a first transistor of first conductivity type, including a gate connected to the second input terminal, a source connected to the first node, and a drain connected to the second power supply terminal via the second current source; and a second transistor of the first conductivity type, including a gate connected to the first input terminal, a source connected to the first node, and a drain connected to the second power supply terminal via the second current source.

According to the differential amplifier circuit of the present invention, two MOS transistors and one current source are simply provided for controlling an output voltage slew rate. Therefore, a high slew rate differential amplifier circuit with a small circuit size can be provided.

DETAILED DESCRIPTION OF THE PREFERRED EMBODIMENT

Referring to the accompanying drawings, an embodiment of a differential amplifier circuit according to the present invention is described below.

Figure 1:
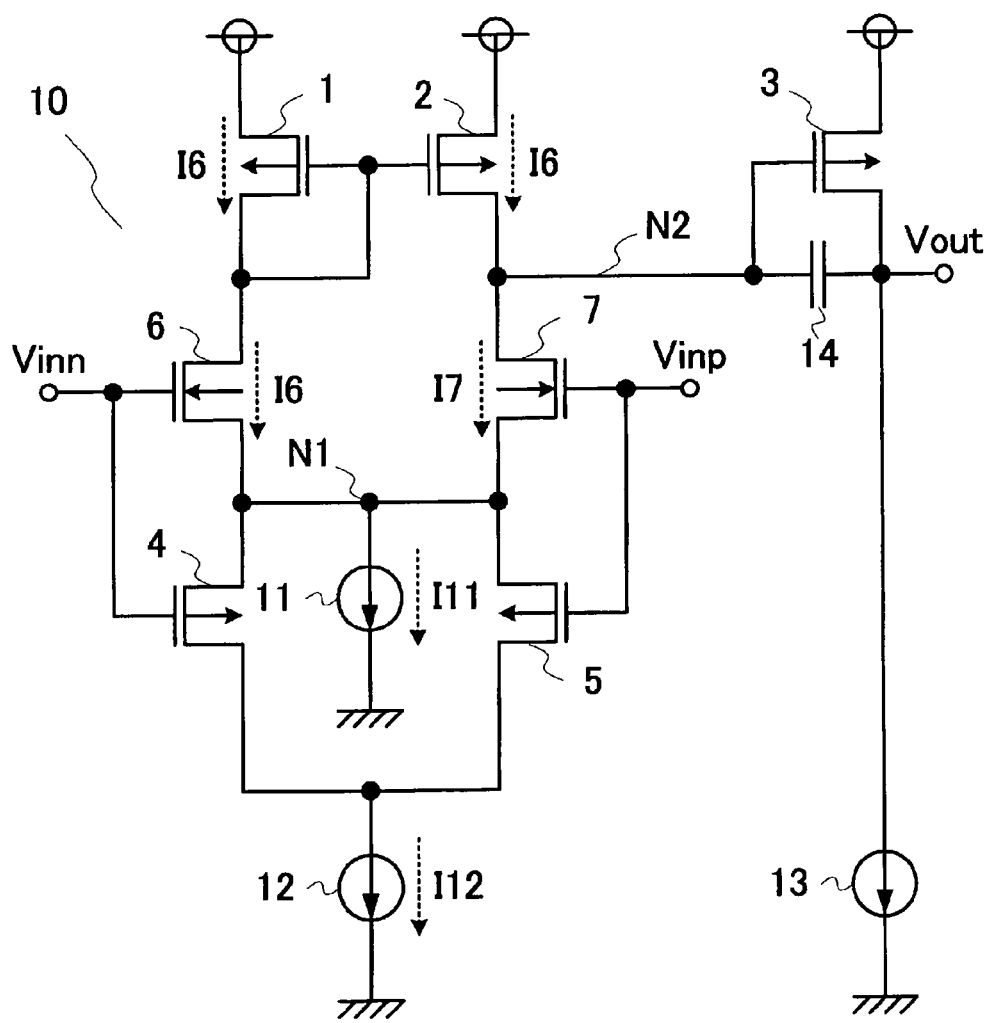
FIG. 1 is a circuit diagram illustrating a differential amplifier circuit according to an embodiment of the present invention.

First, a configuration of the differential amplifier circuit is described. FIG. 1 is a circuit diagram illustrating the differential amplifier circuit.

A differential amplifier circuit 10 includes PMOS transistors 1 to 5, NMOS transistors 6 and 7, current sources 11 to 13, and a capacitor 14. The differential amplifier circuit 10 further includes a non-inverting input terminal, an inverting input terminal, and an output terminal. The PMOS transistor 1 and the PMOS transistor 2 together form a current mirror circuit. The current mirror circuit has a first terminal corresponding to a connection node between a gate and a drain of the PMOS transistor 1 and a second terminal corresponding to a drain of the PMOS transistor 2.

The PMOS transistor 1 has the gate connected to the drain thereof, a gate of the PMOS transistor 2, and a drain of the NMOS transistor 6. The PMOS transistor 1 has a source connected to a power supply terminal. The PMOS transistor 2 has a source connected to the power supply terminal and the drain connected to a node of a voltage V2.

The NMOS transistor 6 has a gate connected to the inverting input terminal of the differential amplifier circuit 10 (node of an input voltage Vinn) and a source connected to a node of a voltage V1. The PMOS transistor 4 has a gate connected to the inverting input terminal of the differential amplifier circuit 10, a source connected to the node of the voltage V1, and a drain connected to a ground terminal via a current source 12. The NMOS transistor 7 has a gate connected to the non-inverting input terminal of the differential amplifier circuit 10 (node of an input voltage Vinp), a source connected to the node of the voltage V1, and a drain connected to the node of the voltage V2. The PMOS transistor 5 has a gate connected to the non-inverting input terminal of the differential amplifier circuit 10, a source connected to the node of the voltage V1, and a drain connected to the ground terminal via the current source 12. The current source 11 is provided between the node of the voltage V1 and the ground terminal.

The PMOS transistor 3 has a gate connected to the node of the voltage V2, a source connected to the power supply terminal, and a drain connected to the output terminal of the differential amplifier circuit 10 (node of an output voltage Vout). The capacitor 14 is provided between the node of the voltage V2 and the output terminal of the differential amplifier circuit 10. The current source 13 is provided between the output terminal of the differential amplifier circuit 10 and the ground terminal.

Next, an operation of the differential amplifier circuit 10 is described.

When a voltage difference occurs between the input voltage Vinp and the input voltage Vinn, a difference occurs between a drain current I7 of the NMOS transistor 7 and a drain current I6 of the NMOS transistor 6. The differential current between the drain current I6 and the drain current I7 charges and discharges a gate capacitor of the PMOS transistor 3 and the capacitor 14, and the voltage V2 at the node N2 varies accordingly. Then, the gate of the PMOS transistor 3 is controlled by the voltage V2, to thereby control the voltage Vout of the output terminal.

For example, if the input voltage Vinp is higher than the input voltage Vinn, the drain current I7 of the NMOS transistor 7 is larger and the drain current I6 of the NMOS transistor 6 is smaller. At the node N2, the drain current I6 flows due to the current mirror circuit, and the drain current I7 starts to flow. The differential current between the drain current I6 and the drain current I7 discharges the gate capacitor of the PMOS transistor 3 and the capacitor 14, and the voltage V2 at the node N2 is reduced accordingly. Therefore, an ON-state resistance of the PMOS transistor 3 is reduced to increase the output voltage Vout.

In this case, if a gate-source voltage of the NMOS transistor 7 is Vgs7, a gate-source voltage of the NMOS transistor 6 is Vgs6, and each threshold voltage of the PMOS transistor 4 and the PMOS transistor 5 is Vtp, then the voltage V1 at the node N1 is calculated by Expression (1) below.

$$V1 = Vinp - Vgs7 \quad (1)$$

Then, if Expression (2) is satisfied, the PMOS transistor 5 is turned ON.

$$V1 - Vinp > |Vtp| \quad (2)$$

Expression (2) can be transformed into Expression (3).

$$-Vgs7 > |Vtp| \quad (3)$$

Further, if Expression (4) is satisfied, the PMOS transistor 4 is turned ON.

$$V1 - Vinn > |Vtp| \quad (4)$$

Expression (4) can be transformed into Expression (5).

$$(Vinp - Vinn) > |Vtp| + Vgs7 \quad (5)$$

Based on the differential voltage between the input voltage Vinp and the input voltage Vinn, the differential amplifier circuit 10 has a first operating state of being driven only with a current I11 of the current source 11 and a second operating state of being driven with a total current (I11+I12) of the current source 11 and the current source 12.

Now, the operations in the first operating state and the second operating state are described by way of example, where the input voltage Vinp is higher than the input voltage Vinn.

First, in the first operating state, the input voltage Vinp is higher than the input voltage Vinn, but the differential voltage (Vinp−Vinn) between those voltages is not high enough to satisfy Expression (5). Therefore, the PMOS transistor 4 is OFF.

Because the NMOS transistor 7 is ON, the gate-source voltage Vgs7 of the NMOS transistor 7 is a positive value and hence Expression (3) is not satisfied. Accordingly, the PMOS transistor 5 is turned OFF.

Therefore, if the differential voltage (Vinp−Vinn) between the input voltage Vinp and the input voltage Vinn is lower than a predetermined voltage (|Vtp|+Vgs7), both of the PMOS transistor 5 and the PMOS transistor 4 are turned OFF. At this time, the current source 12 is not connected in parallel to the current source 11, and the current source 12 does not supply a drive current to the differential amplifier circuit 10. In other words, only the current source 11 supplies the current I11 to the differential amplifier circuit 10 as the drive current. Based on the drive current I11, the differential current between the drain current I6 and the drain current I7 charges and discharges the gate capacitor of the PMOS transistor 3 and the capacitor 14, to thereby vary the voltage V2 and the output voltage Vout.

Next, in the second operating state, the input voltage Vinp is higher than the input voltage Vinn, and the differential voltage (Vinp−Vinn) between those voltages is high enough to satisfy Expression (5). Therefore, the PMOS transistor 4 is turned ON.

Because the NMOS transistor 7 is ON, the gate-source voltage Vgs7 of the NMOS transistor 7 is a positive value and hence Expression (3) is not satisfied. Accordingly, the PMOS transistor 5 is turned OFF.

Therefore, if the differential voltage (Vinp−Vinn) between the input voltage Vinp and the input voltage Vinn is higher than the predetermined voltage (|Vtp|+Vgs7), the PMOS transistor 4 is turned ON. At this time, the current source 12 is connected in parallel to the current source 11, and the current source 12 supplies the drive current to the differential amplifier circuit 10. In other words, the current sources 11 and 12, rather than only the current source 11, supply the total current (I11+I12) to the differential amplifier circuit 10 as the drive current. Based on the drive current (I11+I12), the differential current between the drain current I6 and the drain current I7 charges and discharges the gate capacitor of the PMOS transistor 3 and the capacitor 14, to thereby vary the voltage V2 and the output voltage Vout. In this case, the drive current of the differential amplifier circuit 10 is increased from the current I11 to the current (I11+I12), and hence each slew rate of the voltage V2 and the output voltage Vout is increased correspondingly.

The case where the input voltage Vinp is higher than the input voltage Vinn is described above, but the same holds true for a case where the input voltage Vinn is higher than the input voltage Vinp.

With the configuration above, when the differential voltage (Vinp−Vinn) between the input voltage Vinp and the input voltage Vinn is higher than the predetermined voltage (|Vtp|+Vgs7), the PMOS transistor 4 is turned ON. At this time, the current source 12 is connected in parallel to the current source 11, and the current source 12 supplies the drive current to the differential amplifier circuit 10. In other words, the current sources 11 and 12, rather than only the current source 11, supply the total current (I11+I12) to the differential amplifier circuit 10 as the drive current. Accordingly, the slew rate of the output voltage Vout is increased. The same holds true for the case where the differential voltage (Vinn−Vinp) is higher than a predetermined voltage (|Vtp|+Vgs6).

Further, two PMOS transistors and the current source 12 are simply required for controlling the slew rate of the output voltage Vout, and hence the differential amplifier circuit 10 is small in circuit size.

Figure 2:
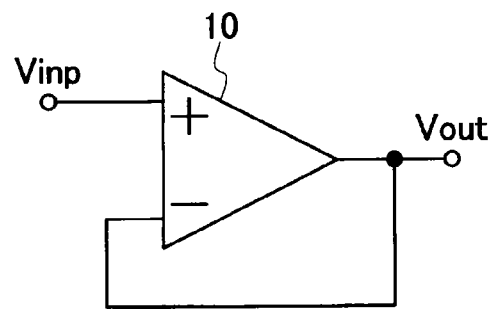
FIG. 2 is a circuit diagram illustrating a voltage follower.
Figure 3:
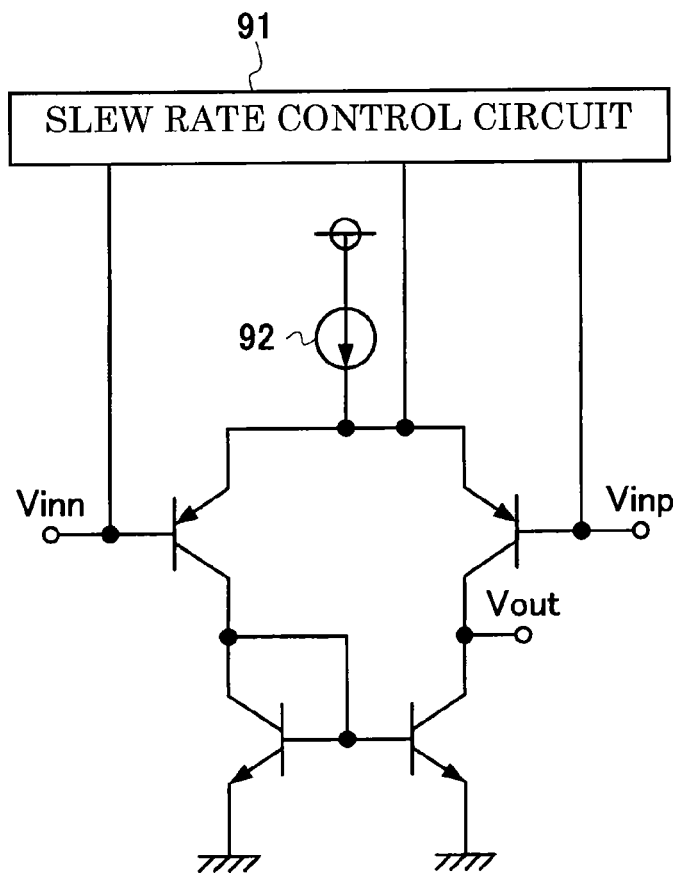
FIG. 3 is a circuit diagram illustrating a conventional differential amplifier circuit.

Note that, when a voltage follower as illustrated in FIG. 2 is formed using the differential amplifier circuit 10, the slew rate of the output voltage Vout can be increased with a small circuit size.

In FIG. 1, the differential amplifier circuit is formed of MOS transistors. Alternatively, although not illustrated, the differential amplifier circuit may be formed of bipolar transistors as appropriate. In this case, the gate, the source, and the drain of the MOS transistor correspond to a base, an emitter, and a collector of the bipolar transistor, respectively.

In FIG. 1, the current mirror circuit is provided on the power supply terminal side, whereas the input stage and the current sources are provided on the ground terminal side. Alternatively, although not illustrated, the current mirror circuit may be provided on the ground terminal side, whereas the input stage and the current sources may be provided on the power supply terminal side.

The PMOS transistors 4 and 5 may be the same as or different from the PMOS transistors 1 and 2 in terms of threshold voltage. For example, if each threshold voltage of the PMOS transistors 4 and 5 is lower than each threshold voltage of the PMOS transistors 1 and 2, the timing at which the PMOS transistor 4 or the PMOS transistor 5 is turned ON is advanced correspondingly. In other words, the timing at which the current source 11 and the current source 12 are connected in parallel so that the drive current for the differential amplifier circuit 10 is increased from the current I11 to the total current (I11+I12) is advanced.

In FIG. 1, the current source 12 and the PMOS transistors 4 and 5 which are provided between the output terminal of the current source 11 (node of the voltage V1) and the output terminal of the current source 12 are provided for the current source 11. In this case, the differential amplifier circuit 10 has a two-stage operating state by the current source 11 and the current source 12. Alternatively, although not illustrated, an additional current source may be provided, and two additional PMOS transistors may be provided newly between the output terminal of the current source 11 and an output terminal of the additional current source. The two additional PMOS transistors are different in threshold voltage from the PMOS transistors 4 and 5. In this case, the differential amplifier circuit 10 has a three-stage operating state by the current source 11, the current source 12, and the additional current source.

What is claimed is:

1. A differential amplifier circuit, comprising:
   a current mirror circuit which includes a first terminal and a second terminal and is provided to a first power supply terminal;
   a first current source provided between a first node and a second power supply terminal;
   a first transistor of second conductivity type, including a gate connected to a second input terminal, a source connected to the first node, and a drain connected to the first terminal of the current mirror circuit;
   a second transistor of the second conductivity type, including a gate connected to a first input terminal, a source connected to the first node, and a drain connected to the second terminal of the current mirror circuit;
   a second current source;
   a first transistor of first conductivity type, including a gate connected to the second input terminal, a source connected to the first node, and a drain connected to the second power supply terminal via the second current source; and
   a second transistor of the first conductivity type, including a gate connected to the first input terminal, a source connected to the first node, and a drain connected to the second power supply terminal via the second current source.

2. The differential amplifier circuit according to claim 1, further comprising:
   a third current source;
   a third transistor of the first conductivity type, including a gate connected to the second input terminal, a source connected to the first node, and a drain connected to the second power supply terminal via the third current source, the third transistor having a threshold voltage different from threshold voltages of the first transistor of the first conductivity type and the second transistor of the first conductivity type; and
   a fourth transistor of the first conductivity type, including a gate connected to the first input terminal, a source connected to the first node, and a drain connected to the second power supply terminal via the third current source, the fourth transistor having a threshold voltage different from the threshold voltages of the first transistor of the first conductivity type and the second transistor of the first conductivity type.

3. The differential amplifier circuit according to claim 1, wherein the current mirror circuit further comprises:
   a fifth transistor of the first conductivity type, including a source connected to the first power supply terminal and a drain connected to the first terminal of the current mirror circuit; and
   a sixth transistor of the first conductivity type, including a gate connected to a gate and the drain of the fifth transistor of the first conductivity type and to the first terminal of the current mirror circuit, a source connected to the first power supply terminal, and a drain connected to the second terminal of the current mirror circuit.

4. The differential amplifier circuit according to claim 2, wherein the current mirror circuit further comprises:
   a fifth transistor of the first conductivity type, including a source connected to the first power supply terminal and a drain connected to the first terminal of the current mirror circuit; and
   a sixth transistor of the first conductivity type, including a gate connected to a gate and the drain of the fifth transistor of the first conductivity type and to the first terminal of the current mirror circuit, a source connected to the first power supply terminal, and a drain connected to the second terminal of the current mirror circuit.

5. The differential amplifier circuit according to claim 3, wherein the first transistor of the first conductivity type and the second transistor of the first conductivity type each have a threshold voltage different from threshold voltages of the fifth transistor of the first conductivity type and the sixth transistor of the first conductivity type.

6. The differential amplifier circuit according to claim 4, wherein the first transistor of the first conductivity type and the second transistor of the first conductivity type each have a threshold voltage different from threshold voltages of the fifth transistor of the first conductivity type and the sixth transistor of the first conductivity type.

* * * * *